(12) United States Patent
Shimada

(10) Patent No.: US 7,541,226 B2
(45) Date of Patent: Jun. 2, 2009

(54) MANUFACTURING PROCESS OF THIN FILM TRANSISTOR

(75) Inventor: Hiroyuki Shimada, Kofu (JP)

(73) Assignee: Seiko Epson Corporation, Tokyo (JP)

( * ) Notice: Subject to any disclaimer, the term of this patent is extended or adjusted under 35 U.S.C. 154(b) by 307 days.

(21) Appl. No.: 11/354,032

(22) Filed: Feb. 15, 2006

(65) Prior Publication Data

US 2006/0216420 A1    Sep. 28, 2006

(30) Foreign Application Priority Data

Mar. 25, 2005    (JP)    ............................. 2005-088138

(51) Int. Cl.
*H01L 21/00*    (2006.01)
(52) U.S. Cl. .................. 438/149; 438/758; 438/778; 257/E21.094; 427/255.18
(58) Field of Classification Search ................ 438/149, 438/758, 778; 257/E21.094; 427/255.18
See application file for complete search history.

(56) References Cited

U.S. PATENT DOCUMENTS

| | | | |
|---|---|---|---|
| 5,902,650 A | 5/1999 | Feng et al. | |
| 6,352,910 B1 | 3/2002 | Harshbarger et al. | |
| 6,794,681 B2 * | 9/2004 | Nakajima et al. | ............. 257/72 |
| 7,129,174 B2 * | 10/2006 | Kim et al. | .................. 438/692 |
| 7,232,742 B1 * | 6/2007 | Maekawa | .................. 438/476 |
| 2002/0014626 A1 * | 2/2002 | Nakajima et al. | ............. 257/59 |
| 2002/0115269 A1 | 8/2002 | Harshbarger et al. | |
| 2003/0213956 A1 * | 11/2003 | Hioki et al. | .................. 257/59 |

FOREIGN PATENT DOCUMENTS

| | | |
|---|---|---|
| JP | A-63-161681 | 7/1988 |
| JP | A-02-281614 | 11/1990 |
| JP | A-09-142821 | 6/1997 |
| JP | A-11-330480 | 11/1999 |
| JP | A-2000-036585 | 2/2000 |

* cited by examiner

*Primary Examiner*—Stanetta D. Issac
(74) *Attorney, Agent, or Firm*—Oliff & Berridge, PLC

(57) ABSTRACT

A manufacturing process of a thin film transistor, includes:
forming a silicon film of a preset thickness, in which film stress becomes under $2.0 \times 10^9$ dyne/cm² in absolute value, on one surface of a transparent substrate; and
forming a thin film transistor on other surface of the transparent substrate on which the silicon film is not formed.

5 Claims, 2 Drawing Sheets

MANUFACTURING PROCESS OF THIN FILM TRANSISTOR

BACKGROUND OF THE INVENTION

1. Technical Field

The invention relates to a manufacturing process of a thin film transistor.

2. Related Art

A thin film transistor is widely used as a switching element of a pixel in an electro-optical device such as a liquid crystal device and an organic electro-luminescence (EL) display.

In such thin film transistor, cost reduction is called for in view of a broad range of its use. As a way of meeting such need, it may be conceived to manufacture thin film transistors by semiconductor manufacturing equipment (semiconductor production line) for silicon substrate to provide for sharing the manufacturing equipment, since this contributes to reducing the cost of manufacturing thin film transistors.

By the way, the thin film transistor as the switching element of the electro-optical device is formed on a transparent quartz substrate. However, a substrate detecting sensor detecting a silicon substrate by using light in the semiconductor manufacturing equipment cannot detect the transparent quartz substrate unlike the silicon substrate.

Accordingly, there is a technique of sharing the semiconductor manufacturing equipment by covering a backside of the quartz substrate with a high-melting point metallic film which is impermeable to light, and forming a silicon film thereon, thus making it possible to detect the quartz substrate through the high melting point metallic film which is impermeable to the light of the substrate detecting sensor (for example, refer to JP-3159919).

JP-3159919 is an example of related art.

If the quartz substrate (transparent substrate) is covered in this manner with a high-melting point metallic film, despite covering the high melting point metallic film with a silicon film, for example, due to a high-temperature process at the time of forming a thin film transistor on the quartz substrate, the high-melting point metallic film may diffuse to such an extent that the thin film transistor to be formed may be contaminated.

To prevent metallic contamination of the thin film transistor, it is preferable to use not the high melting point metallic film to cover the quartz substrate but only the silicon film so that the substrate detecting sensor can detect the quartz substrate. At this time, covering the quartz substrate with a silicon film of such a film thickness as to make it more than approximately 5 μm thick enables this silicon film to be impermeable to light like the high melting point metallic film, whereby the quartz substrate can be properly detected by the substrate detection sensor.

But, if the thickness of the silicon film exceeds 5 μm, its film stress grows to cause bowing on the quartz substrate. It becomes impossible to form a proper thin film transistor on a quartz substrate having the bowing. Consequently, it was not practical to share semiconductor manufacturing equipment between the quartz substrate and the silicon substrate and so it was difficult to reduce the cost of the thin film transistor.

SUMMARY

An advantage of some aspects of the invention is to provide a manufacturing process of a thin film semiconductor which can provide a low-cost, proper thin film transistor by making it possible to share semiconductor manufacturing equipment for silicon substrate when forming a thin film transistor on a quartz substrate.

According to a first aspect of the invention, a manufacturing process of a thin film transistor includes: forming a silicon film of a thickness preset such that film stress on one side of a transparent substrate may be under $2.0 \times 10^9$ dyne/cm$^2$ in absolute value; and thereafter, forming a thin film transistor on another side of the transparent substrate with no formation of the silicon film.

In a manufacturing process of a thin film according to the invention, as regards the silicon film covering one side of the transparent substrate, film stress has very little effect (under $2.0 \times 10^9$ dyne/cm$^2$ in absolute value, preferably under $1.0 \times 10^9$ dyne/cm$^2$) upon bowing of the transparent substrate, therefore, there will be no bowing of the transparent substrate on which the silicon film is formed. Because of no bowing generated on the transparent substrate, no problems in terms of processing occur in an exposure process and the like, thereby enabling a proper thin film transistor to be formed on the transparent substrate.

At this point, the transparent substrate is such that the thickness of the silicon film is preset so as not to let light pass through, hence, the surface of the transparent substrate on which the silicon film was formed is, like the silicon substrate, impermeable to light.

Consequently, since the surface of the transparent substrate covered with the silicon film does not let light pass through like the silicon substrate, for example, a substrate detecting sensor in the semiconductor manufacturing equipment for silicon substrate becomes capable of detecting the transparent substrate as the silicon substrate.

Namely, the semiconductor manufacturing equipment becomes capable of detecting the transparent substrate and the silicon substrate, so that the semiconductor manufacturing equipment can be jointly used between the transparent substrate and the silicon substrate. Accordingly, it is possible to reduce the cost when manufacturing a thin film transistor on the transparent substrate.

Further, because only the silicon film is formed on the transparent substrate, metallic contamination due to a high melting point metallic film in the currently available manufacturing process can be prevented.

According to a second aspect of the invention, the manufacturing process of a thin film transistor includes; at least two silicon films of different film-making conditions stacked up on the one surface of the transparent substrate such as to be of a preset thickness; and thereafter, forming a thin film transistor on the other side of the transparent substrate with no silicon film formed thereon.

In the manufacturing process of a thin film according to the invention, if the film-making conditions of different silicon films are such that, for example, silicon film generating compression stress and silicon film generating tensile stress are deposited together so that mutual stresses may be canceled out, the transparent substrate will not bow due to the film stress of the silicon film. Hence, because of no generation of bowing on the transparent substrate, it is possible to form properly a thin film transistor on this transparent substrate.

Note that by making the thickness of the silicon film preset such as to prevent the above-referenced light from passing through, the surface of the transparent substrate, on which is formed the silicon film, will not permit the light to pass through like the silicon substrate.

Since the transparent substrate is covered with a silicon film of sufficient film thickness, it can be detected by the substrate detecting sensor of the semiconductor manufacturing equipment for silicon substrate, and so this semiconductor manufacturing equipment can be used for transparent substrates as well.

Accordingly, the semiconductor manufacturing equipment can be shared between the transparent substrate and the silicon substrate, thus contributing to reducing the cost of making a thin film transistor on the transparent substrate. Further, because only the silicon film is formed on the transparent substrate, metallic contamination due to the high melting point metallic film according to the currently available technique can be prevented. Therefore, low-cost thin film transistors of excellent quality can be produced.

In the manufacturing process of a thin film transistor, it is preferable, as the silicon films of different film-making condition, to stack a first silicon film generating tensile stress on a second silicon film generating compression stress of a magnitude which approximately cancels out the tensile stress. Such arrangement enables the film stress generating on the transparent substrate due to the silicon film to cancel out by forming the first silicone film and the second silicon film, thus preventing the film stress from generating on the transparent substrate. Accordingly, the bowing of the transparent substrate can be prevented.

At this point, in the manufacturing process of the thin film transistor, it is preferable to form the second silicon film through plasma CVD after forming the first silicon film by chemical CVD. For example, by forming the first silicon film through low-pressure CVD (LPCVD), this enables tensile stress to generate on the first silicon film. Further, for example, by forming the second silicon film through high density CVD (HDCVD), this enables compression stress to generate on the second silicon film.

Consequently, the first silicon film and the second silicon film being stacked up cancel out the tensile stress and the compression stress and prevents generation of the film stress of the silicon film covering the transparent substrate.

In the manufacturing process of a thin film transistor, it is preferable to provide a process of removing the silicon film after forming the thin film transistor on the transparent substrate. This arrangement makes it possible to obtain a transparent substrate whose both surfaces are transparent with provision of a low cost thin film transistor of excellent quality. Hence, this transparent substrate can be used, for example, as a transparent substrate for a light transmission type liquid crystal panel and an organic El display.

BRIEF DESCRIPTION OF THE DRAWINGS

The invention will be described with reference to the accompanying drawings, wherein like numbers refer to like elements.

DESCRIPTION OF THE EMBODIMENT

An embodiment of a manufacturing process of a thin film transistor of the invention will be described below. FIGS. 1A to 1D are diagrams explaining a manufacturing process of a thin film transistor according to the embodiment. In the embodiment, description will be made of a process of manufacturing an n-channel polysilicon thin film transistor (TFT) on a quartz substrate used as a transparent substrate.

First, on one surface of the quartz substrate at least two silicon films of different film-making conditions, specifically, a first silicon film and a second silicon film to be explained later, are stacked up such as to provide for a preset thickness. The preset thickness herein indicates a film thickness of a silicon film to be formed on a backside of the quartz substrate 1 which does not permit light to pass through, that is, a thickness of over 5 μm.

According to the first film-making condition, the first silicon film is formed.

Figure 1A:
FIGS. 1A to 1D are diagrams showing a manufacturing process of a thin film transistor.

At this point, the quartz substrate 1, which is 625 μm thick, is prepared as shown in FIG. 1A. And the quartz substrate 1 is placed in a reaction furnace of a CVD apparatus (not illustrated) to perform low-pressure CVD as chemical vapor deposition.

In the low-pressure CVD, the inside of the reaction furnace is depressurized by a vacuum pump and a silane gas ($SiH_4$) is fed therein as a reaction gas. Further, in the low-pressure CVD, an average free process is made longer through depressurization despite a slow growth rate, and a high uniformity of film thickness can be obtained.

Figure 1B:
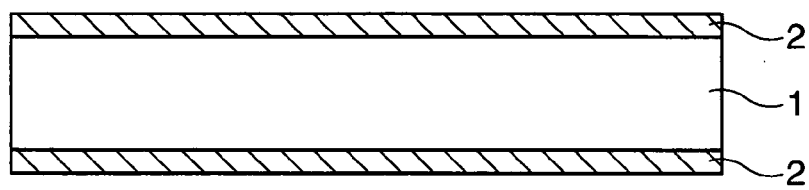

In the embodiment, by carrying out the low-pressure CVD described above under a condition of 615° C., as shown in FIG. 1B, a polysilicon film (first silicon film) 2 of a 2.7 μm thickness was formed on both sides of the quartz substrate 1.

Incidentally, it is experimentally known that the polysilicon film 2 made according to the low-pressure CVD generates tensile stress as a film stress, and a tensile stress of $+1.0 \times 10^{10}$ dyn/cm² generates in the embodiment.

At this time, as shown in FIG. 1A, the polysilicon film 2 is formed on both surfaces of the quartz substrate 1, so that the tensile stress of the polysilicon film 2 is canceled out between the front side and the back side of the quartz substrate 1. Therefore, the film stress of the polysilicon film 2 will not affect the quartz substrate 1.

Next, according to the second film-making condition, the second silicon film is formed.

At this point, the quartz substrate 1 having the polysilicon film 2 formed on the both surfaces is placed in the reaction furnace of the CVD apparatus (not illustrated) to perform high-density plasma CVD.

In the high-density plasma CVD, gas molecules are dissociated in plasma, a chemical reaction (radical reaction) is promoted, and a film is formed at a low temperature (250 to 400° C.) as compared to the low-pressure CVD. Note that in the high-density plasma CVD, unlike the low-pressure CVD, because of a structure of a leaf-spring device, a silicon film is formed only on one surface side.

Figure 1C:
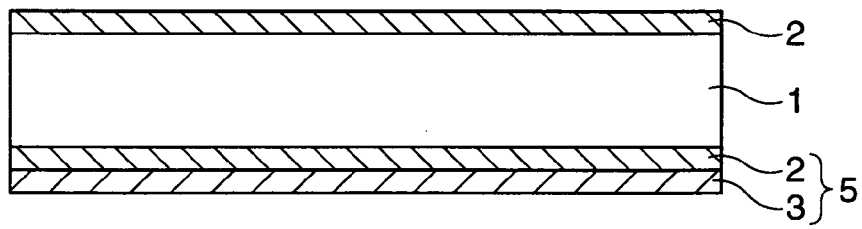

In the embodiment, by carrying out the high-density plasma CVD under a condition of less than 400° C., as shown in FIG. 1C, an amorphous silicon film (second silicon film) 3 which is 2.7 μm thick was formed on a surface of one polysilicon film 2 side (underside in the figure).

Note that in the following description, a side where the amorphous silicon film 3 was formed is set as the back side of the quartz substrate 1 and on the surface of this quartz substrate 1, a thin film transistor is formed by a process to be explained later.

Incidentally, it is experimentally known that the amorphous silicon film 3 made according to the high-density plasma CVD generates compression stress as a film stress, and a compression stress of $-1.0 \times 10^{10}$ dyn/cm² generates in the embodiment.

Accordingly, the polysilicon film 2 and the amorphous silicon film 3 are stacked up on the back side of the quartz substrate 1 to create a state where a silicon film 5 of a total thickness of 5.4 μm is formed. At this time, the tensile stress ($+1.0 \times 10^{10}$ dyn/cm²) due to the polysilicon film 2 and the compression stress ($-1.0 \times 10^{10}$ dyn/cm²) due to the amorphous silicon film 3 are canceled out. Therefore, the silicon film 5 which is composed of the polysilicon film 2 and the amorphous silicon film 3 generates no film stress with respect to the quartz substrate 1.

On the other hand, there is only the polysilicon film 2 formed on the surface of the quartz substrate 1 (upper side in FIG. 1C). At this point, as referenced above, the polysilicon film 2 is in the state of generating the tensile stress ($+1.0 \times 10^{10}$ dyn/cm$^2$), so that there still remains the tensile stress on the surface of the quartz substrate 1.

Figure 1D:
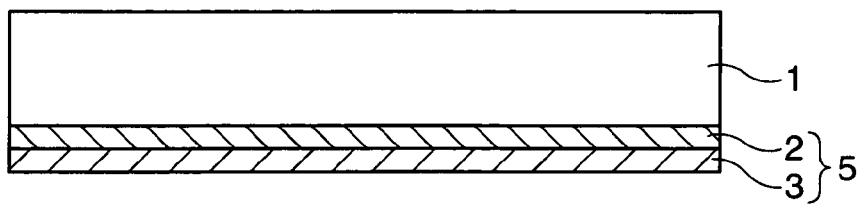

Now, as shown in FIG. 1D, the polysilicon film 2 formed on the front side of the quartz substrate 1 is removed, for example, by dry etching and the like. Therefore, the quartz substrate 1 is constituted such that its back side is provided with the silicon film 5 which is 5.4 μm thick. Further, as described above, no film stress is generated on the silicon film 5 so that no bowing occurs on the quartz substrate 1. Consequently, a substrate bowing when a silicon film, over 5.4 μm thick, is formed on the quartz substrate 1, can be prevented.

Accordingly, since no bowing generates on the quartz substrate 1, as described later, a proper n-channel polysilicon thin film transistor (TFT) can be formed on this quartz substrate 1.

By the way, it is known from experiments and the like that the film stress on the silicon film 5 be under $2.0 \times 10^9$ dyn/cm$^2$ in absolute value, preferably under $1.0 \times 10^9$ dyn/cm$^2$, to prevent bowing, which poses processing problems, from generating on the quartz substrate 1.

Therefore, in a case where it is difficult to eliminate film stress generating on this silicon film 5 by completely canceling out the compression stress and the tensile stress in the silicon film 5, it is possible to prevent the quartz substrate 1 from bowing by forming the silicon film 5 of the preset thickness (over 5 μm) such that the film stress on the silicon film 5 is held under $2.0 \times 10^9$ dyn/cm$^2$ in absolute value, preferably under $1.0 \times 10^9$ dyn/cm$^2$.

The silicon film 5 is set such that its film thickness is 5.4 μm (over 5 μm), thus satisfying the preset thickness. Namely, the back side of the quartz substrate 1 with the formation of the silicon film 5 thereon does not permit light to pass through like the silicon substrate.

Incidentally, a thin film transistor formed on the transparent substrate such as the quartz substrate is widely used, for example, in electro-optical devices including a liquid crystal display and an organic EL display. In view of its various usage, cost reduction is being called for.

Accordingly, if a thin film transistor is manufactured on the quartz substrate 1 by using the semiconductor manufacturing equipment (semiconductor production line) for silicon substrate, cost reduction can be attained. Note that as the semiconductor equipment, it is the equipment for forming a transistor on a silicon wafer (silicon substrate), which is, specifically, each unit of lithography, dry etching, ion implantation, CVD and the like.

A substrate detecting sensor (not illustrated) with which the semiconductor manufacturing equipment is equipped is a light detection type which, for example, lets a laser beam from a beam emitting section reflected on the surface of the silicon substrate, while the reflected light is received by a beam receiving section, thereby detecting the silicon substrate. And as referenced above, the silicon film 5 provided on the back side of the quartz substrate 1 having a sufficient thickness does not permit the beam to pass through.

Accordingly, the substrate detecting sensor for silicon substrate is able to detect the quartz substrate 1 like the silicon substrate.

Namely, use of the invention makes it possible to recognize the quartz substrate 1 as a silicon substrate through the semiconductor manufacturing equipment for silicon substrate, and it is possible to form a polysilicon TFT in a process to be explained later.

Figure 2:
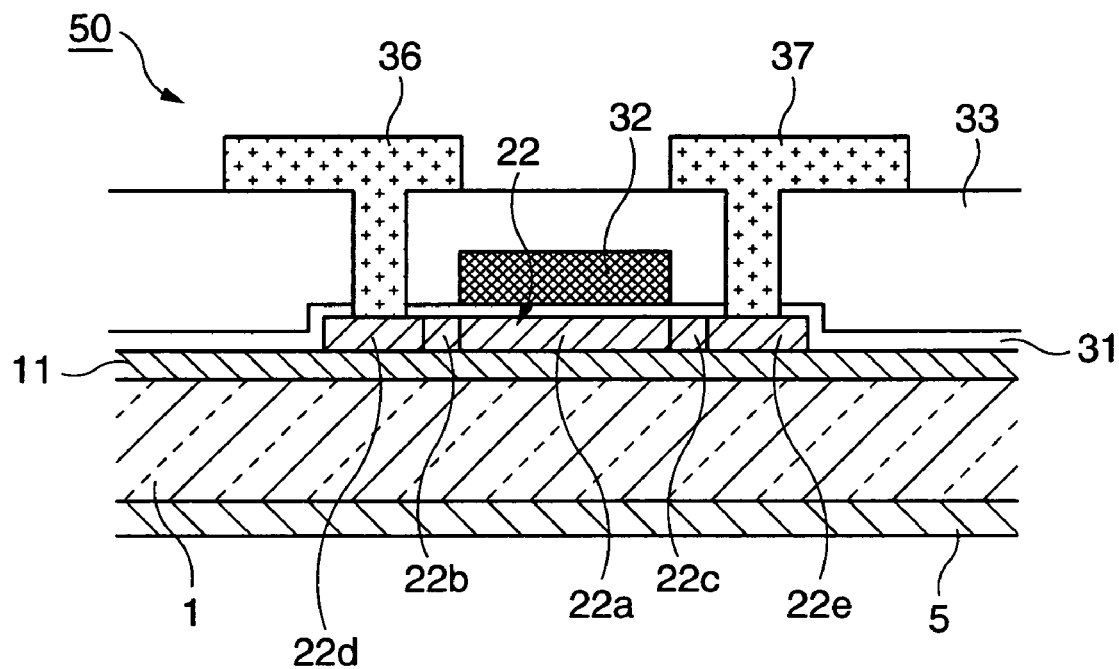
FIG. 2 is a side sectional view of a thin film transistor formed according to the invention.

Next, description will be made of a process of forming an n-channel polysilicon thin film transistor (TFT) 50 on the surface of the quartz substrate on which the silicon film 5 is not formed, as shown in FIG. 2, by using the semiconductor manufacturing equipment for silicon substrate. Note that since the manufacturing process of the polysilicon TFT is based on a publicly known method, description will be made by omitting illustrations.

First, on the surface of the quartz substrate 1 on the backside of which the silicon film 5 was formed, an undercoat protective film 11 consisting of an insulation film such as a silicon oxide film is subjected to film-making by the plasma CVD and the like.

And over the entire surface of the quartz substrate on which the undercoat protective film 11 was formed, an amorphous silicon film is built by the plasma CVD and the like.

Next, through photolithography, this amorphous silicon film is patterned into a shape of an active layer to be formed. Namely, after coating a photoresist on the amorphous silicon film, the patterning of the amorphous silicon film is carried out by exposing and developing the photoresist, etching the amorphous silicon film, and removing the photoresist.

By irradiating with laser, under the low-pressure atmosphere in a nitrogen atmosphere, from the amorphous silicon film side to the entire surface of the quartz substrate 1 on which the amorphous silicon film was formed, the amorphous silicon film which was patterned is subjected to annealing thus to form a polysilicon film 22 which functions as the active layer. Note that in this process, the amorphous silicon film irradiated with laser is heated and melted by laser energy applied to the amorphous silicon film and polycrystallized after going though a cooling and solidification process.

Next, over the entire surface of the quartz substrate 1 on which the polysilicon film 22 was formed, a gate insulating film 31 consisting of a silicon oxide film, a silicon nitride film and the like are built up for a thickness of 50 to 150 nm.

After making a film of conductive materials of an alloy mainly composed of metals such as aluminum, tantalum, and molybdenum or any of such metals over the entire surface of the quartz substrate 1, on which the gate insulating film 31 was formed, by sputtering and the like, it is subjected to patterning through photolithography to form a gate electrode 32, which is 300 to 800 nm thick.

Namely, after coating a photoresist on the quartz substrate 1 on which a film of a conductive material is made, the conductive material is subjected to patterning by exposing and developing the photoresist, etching the conductive material, and removing the photoresist, whereby the gate electrode 32 is formed.

With the gate electrode 32 as a mask, an impurity ion (phosphoric ion) of low concentration is implanted at a dose of approx. $0.1 \times 10^{13}$ to approx. $10 \times 10^{13}$/cm$^2$, thus forming a low concentration source region 22b and a low concentration drain region 22c in terms of self-alignment with respect to the gate electrode 32. At this point, a portion located directly below the gate electrode 32, to which no impurity ion was introduced, becomes a channel region 22a.

There is formed a photoresist mask (illustration omitted) wider than the gate electrode 32, to which an impurity ion (phosphoric ion) of high concentration is injected at a dose of approx. $0.1 \times 10^{15}$ to approx. $10 \times 10^{15}$/cm$^2$, thus forming a high concentration source region 22d and a high concentration drain region 22e.

It should be noted that in lieu of forming the source region and the drain region of a lightly doped drain (LDD) structure, while implantation of an impurity of a low concentration is not carried out, with a wider photoresist mask than the gate electrode 32 being formed, an impurity (phosphoric ion) of high concentration may be implanted thus to form a source region and a drain region of an offset structure. Further, an impurity of high concentration may be implanted with the gate electrode 32 as a mask, thus forming a source region and a drain region of a self-aligned structure.

Next, an interlayer insulator 33 consisting of a silicon oxide film and the like is built up to a thickness of 300 to 800 nm through the CVD and the like on the front side of the gate electrode 32. And, after this process, laser annealing is conducted to activate the impurity implanted into the source regions 22b and 22d as well as the drain regions 22c and 22e.

Then, after forming a photoresist mask (illustration omitted) of a preset pattern, through the photoresist mask, the interlayer insulator 33 is subjected to dry etching, thereby respectively forming contact holes 34 and 35 at portions corresponding to the high concentration source region 22d and the high concentration drain region 22e in the interlayer insulator 33.

After making a film of conductive materials of an alloy mainly composed of metals such as aluminum, titanium, titanium nitride, tantalum, molybdenum or any of such metals by sputtering and the like over the entire surface of the interlayer insulator 33, patterning is carried out by photolithography to form a source electrode 36 and a drain electrode 37 of a thickness of 400 to 800 nm.

Namely, after coating a photoresist on the quartz substrate 1 which has a film made of a conductive material, the patterning of the conductive material is carried out and the source electrode 36 and the drain electrode 37 are formed by exposing and developing the photoresist, etching the conductive material, and removing the photoresist.

In a manner described above, it is possible to manufacture a thin film transistor, that is, an n-channel polysilicon TFT 50 in the embodiment.

After forming the n-channel polysilicon TFT 50 over the surface of the quartz substrate 1, according to application of the quartz substrate 1, a silicon film 5 on the back side may be removed by a method such as dry etching as necessary. With such arrangement, it is possible to obtain the quartz substrate 1 having transparency on both surfaces at low cost, with the provision of a proper polysilicon thin film transistor (TFT) 50.

Accordingly, this quartz substrate 1 can be used, for example, as a light transmission type liquid crystal panel and a substrate having transparency of an organic El display.

According to a manufacturing process of a thin film transistor of the invention, as silicon films having different film-making conditions, a silicon film 5 is formed by stacking up the polysilicon film 2 generating tensile stress and the amorphous silicon film 3 generating compression stress such as to cancel out mutual stresses, and since the absolute value of the film stress of the silicon film 5 is small enough (under $2.0 \times 10^9$ dyne/cm$^2$, preferably under $1.0 \times 10^9$ dyne/cm$^2$) for the quartz substrate 1 not to bow, the quartz substrate 1 will not bow due to the film stress of the silicon film 5.

Consequently, because no bowing generates in the quartz substrate 1, it is possible to properly form the n-channel polysilicon TFT 50 on this quartz substrate 1.

Further, the silicon film 5 having a thickness exceeding 5 μm which does not permit light to pass through as referenced above, the surface of the transparent substrate on which the silicon film 5 was formed does not permit light to pass through like the silicon substrate.

Therefore, since the quartz substrate 1 is covered with the silicon film 5 of a sufficient thickness, it is possible to perform detection with a substrate detecting sensor of the semiconductor manufacturing equipment for silicon substrate, and the quartz substrate 1 can be used by the semiconductor manufacturing equipment. Hence, between the quartz substrate 1 and the silicon substrate, the semiconductor manufacturing equipment can be shared, so that the manufacturing cost when manufacturing a thin film transistor on the quartz substrate 1 can be reduced.

Furthermore, because only the silicon film is formed on the quartz substrate 1, metallic contamination due to a high melting point metallic film in the currently available manufacturing process can be avoided.

It should be noted that the invention is not limited to the embodiment but various modifications are possible. For example, in the embodiment, as the silicon film 5, the polysilicon film 2 generating tensile stress and the amorphous silicon film 3 generating compression stress are stacked up such as to cancel out mutual stresses. By carrying out CVD through adjustments of the film-making conditions, it may be arranged such that a single layer silicon film having a film stress small enough not to cause the quartz substrate to bow (under $2.0 \times 10^9$ dyne/cm$^2$ in absolute value, preferably under $1.0 \times 10^9$ dyne/cm$^2$) and having a thickness exceeding 5 μm is formed.

The entire disclosure of Japanese Patent Application No. 2005-088138, filed Mar. 25, 2005 is expressly incorporated by reference herein.

What is claimed is:

1. A manufacturing process of a thin film transistor, comprising:
    forming a silicon film of a preset thickness, in which film stress becomes under $2.0 \times 10^9$ dyne/cm$^2$ in absolute value, on one surface of a transparent substrate; and
    forming a thin film transistor on other surface of the transparent substrate on which the silicon film is not formed.

2. A manufacturing process of a thin film transistor, comprising:
    depositing up at least two silicon films of different film-making conditions on one surface of a transparent substrate to a preset thickness; and
    forming thereafter a thin film transistor on the other surface of the transparent substrate on which the silicon film is not formed,
    wherein a total thickness of the at least two silicon films is greater than 5 microns.

3. The manufacturing process of a thin film transistor according to claim 2, wherein a first silicon film generating tensile stress and a second silicon film generating compression stress of an approximate magnitude such as to cancel out the tensile stress are stacked up as the silicon films of the different film-making conditions.

4. The manufacturing process of a thin film transistor according to claim 3, wherein the first silicon film is formed by chemical CVD, the second silicon film being formed by plasma CVD.

5. The manufacturing process of a thin film transistor according to claim 1, wherein the silicon film is peeled off after the thin film transistor is formed on the transparent substrate.

\* \* \* \* \*